(12) United States Patent
Nahas et al.

(10) Patent No.: US 7,154,772 B2
(45) Date of Patent: Dec. 26, 2006

(54) MRAM ARCHITECTURE WITH ELECTRICALLY ISOLATED READ AND WRITE CIRCUITRY

(75) Inventors: Joseph J. Nahas, Austin, TX (US); Thomas W. Andre, Austin, TX (US); Chitra K. Subramanian, Austin, TX (US); Bradley J. Garni, Austin, TX (US); Mark A. Durlam, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/076,523

(22) Filed: Mar. 9, 2005

(65) Prior Publication Data

US 2005/0152183 A1 Jul. 14, 2005

Related U.S. Application Data

(62) Division of application No. 10/185,868, filed on Jun. 28, 2002, now Pat. No. 6,903,964.

(51) Int. Cl.
*G11C 11/00* (2006.01)

(52) U.S. Cl. ............... 365/158; 365/97; 365/230.06; 257/411

(58) Field of Classification Search ............... 365/158, 365/230.06, 97; 257/411
See application file for complete search history.

(56) References Cited

U.S. PATENT DOCUMENTS 5,946,227 A 8/1999 Naji
6,111,781 A 8/2000 Naji
6,191,989 B1 2/2001 Luk et al.
6,246,083 B1* 6/2001 Noble .................... 257/296
6,246,386 B1* 6/2001 Perner .................... 345/90
6,256,247 B1 7/2001 Perner
6,272,041 B1 8/2001 Naji
6,335,890 B1 1/2002 Reohr et al.
6,743,681 B1* 6/2004 Bhattacharyya ........ 257/411
2003/0117834 A1 6/2003 Iwata et al.
2003/0123281 A1* 7/2003 Iwata et al. ............. 365/158

\* cited by examiner

*Primary Examiner*—Huan Hoang
(74) *Attorney, Agent, or Firm*—James L. Clingan, Jr.; Robert L. King

(57) ABSTRACT

A magnetoresistive random access memory (MRAM) has separate read and write paths. This reduces the peripheral circuitry by not requiring switching between read and write functions on a particular line. By having the paths dedicated to either read signals or write signals, the voltage levels can be optimized for these functions. The select transistors, which are part of only the read function, may be of the low-voltage type because they do not have to receive the relatively higher voltages of the write circuitry. Similarly, the write voltages do not have to be degraded to accommodate the lower-voltage type transistors. The size of the overall memory is kept efficiently small while improving performance. The memory cells are grouped so that adjacent to groups are coupled to a common global bit line which reduces the space required for providing the capacitance-reducing group approach to memory cell selection.

2 Claims, 10 Drawing Sheets

MRAM ARCHITECTURE WITH ELECTRICALLY ISOLATED READ AND WRITE CIRCUITRY

RELATED APPLICATIONS

This application is a divisional of U.S. patent application Ser. No. 10/185,868, filed Jun. 28, 2002, now U.S. Pat. No. 6,903,964.

This application is related to:

U.S. patent application Ser. No. 09/978,859, entitled "A Method of Writing to a Scalable Magnetoresistance Random Access Memory Element," filed Oct. 16, 2001, and assigned to the assignee hereof; and U.S. patent application Ser. No. 10/186,141, entitled "Circuit and Method of Writing a Toggle Memory," filed simultaneously herewith, and assigned to the assignee hereof.

FIELD OF THE INVENTION

This invention relates to Magnetoresistive Random Access Memories (MRAMs), and more particularly to architectures for MRAMs.

BACKGROUND OF THE INVENTION

In any memory type, including MRAMs, there is a continuing desire to reduce the memory size and increase performance. One important aspect of performance is the speed with which the memory is read and programmed (written). Speed limitations include such things as the performance of the bit cell and the capacitance of the lines running through the array. A variety of techniques have been developed to improve these characteristics. For example, memory arrays have commonly been divided into subarrays so that no single line is excessively capacitive. This can also reduce power consumption. Such techniques in MRAMs have been developed to reduce the capacitance of bit lines by grouping cells into a group of cells. A global bit line is selectively coupled to only the group that is selected. This had the beneficial effect of reducing the number of memory cells that were coupled to the global bit line.

The promise of MRAMs is, however, that of a universal memory that can be high speed and non-volatile. Thus, the need for improvements in speed and memory area efficiency continue. Thus, there is need for further improvements in architecture for MRAMs.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 4 is a graph illustrating the timing diagram of the word current and the bit current when both are turned on;

FIG. 9 is a graph illustrating the timing diagram of the word current and the bit current when only the bit current is turned on;

FIG. 10 is a graph illustrating the rotation of the magnetic moment vectors for a magnetoresistive random access memory device when only the bit current is turned on;

DETAILED DESCRIPTION OF THE PREFERRED EMBODIMENT

A memory architecture uses separate word lines for the read and write operations as well as separate bit lines for the read and write operations and is grouped into groups of bits with common local read bit lines. The groups are further folded so that two groups that are selectively coupled to the same global bit line share the same word lines. These characteristics provide the benefits of smaller write driver area, smaller average bit size for the memory core, allowing overlap between read and write operations, reduced global bit line capacitance, and higher voltage writing.

Figure 1:
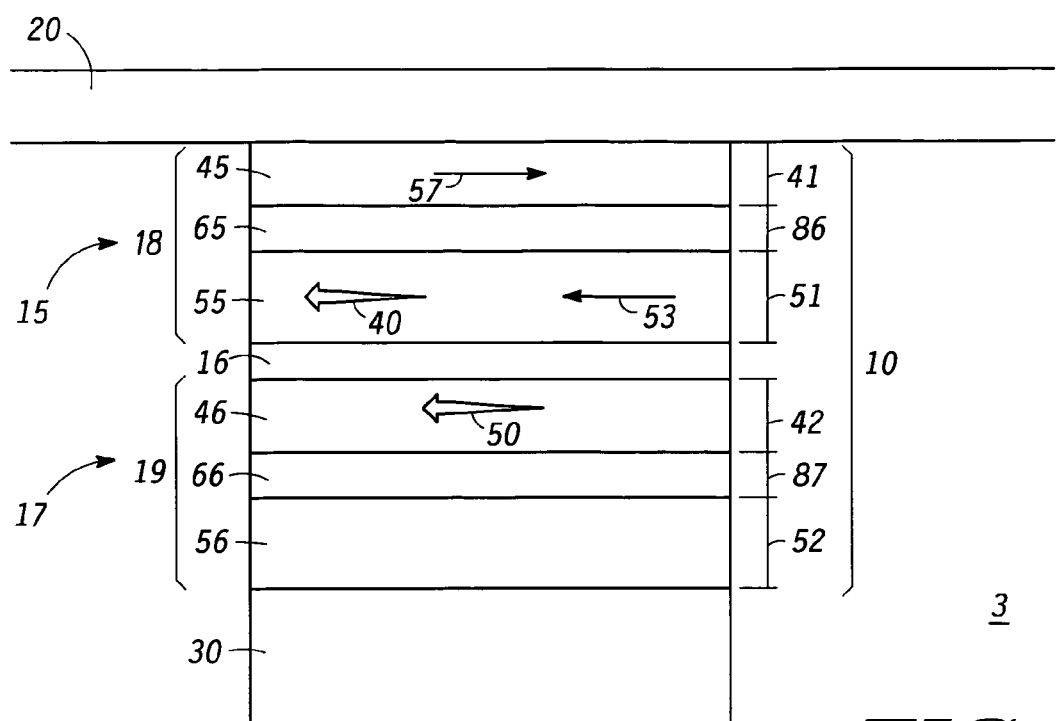
FIG. 1 is a simplified sectional view of a magnetoresistive random access memory device.

Turn now to FIG. 1, which illustrates a simplified sectional view of an MRAM array 3 in accordance with the preferred embodiment of the present invention. In this illustration, only a single magnetoresistive memory device 10 is shown, but it will be understood that MRAM array 3 consists of a number of MRAM devices 10 and we are showing only one such device for simplicity in describing the writing method.

MRAM device 10 includes a write word line 20 and a write bit line 30. Write word line 20 and write bit line 30 include conductive material such that a current can be passed therethrough. In this illustration, write word line 20 is positioned on top of MRAM device 10 and write bit line 30 is positioned on the bottom of MRAM device 10 and is directed at a 90° angle to word line 20 (See FIG. 2). As an alternative, write word line 20 may be positioned on the bottom of MRAM device 10 and write bit line 30 may be positioned on top of MRAM device 10.

MRAM device 10 includes tunnel junction comprising a first magnetic region 15, a tunneling barrier 16, and a second magnetic region 17, wherein tunneling barrier 16 is sandwiched therebetween first magnetic region 15 and second magnetic region 17. In the preferred embodiment, magnetic region 15 includes a tri-layer structure 18, which has an anti-ferromagnetic coupling spacer layer 65 between two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic (SAF) layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably 45°, from write word line 20 and write bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of 1 to 5 for a non-circular plan. However, we illustrate a plan that is circular (See FIG. 2). MRAM device 10 is circular in shape in the preferred embodiment to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between write word line 20 and write bit line 30, as will be discussed presently.

Figure 2:
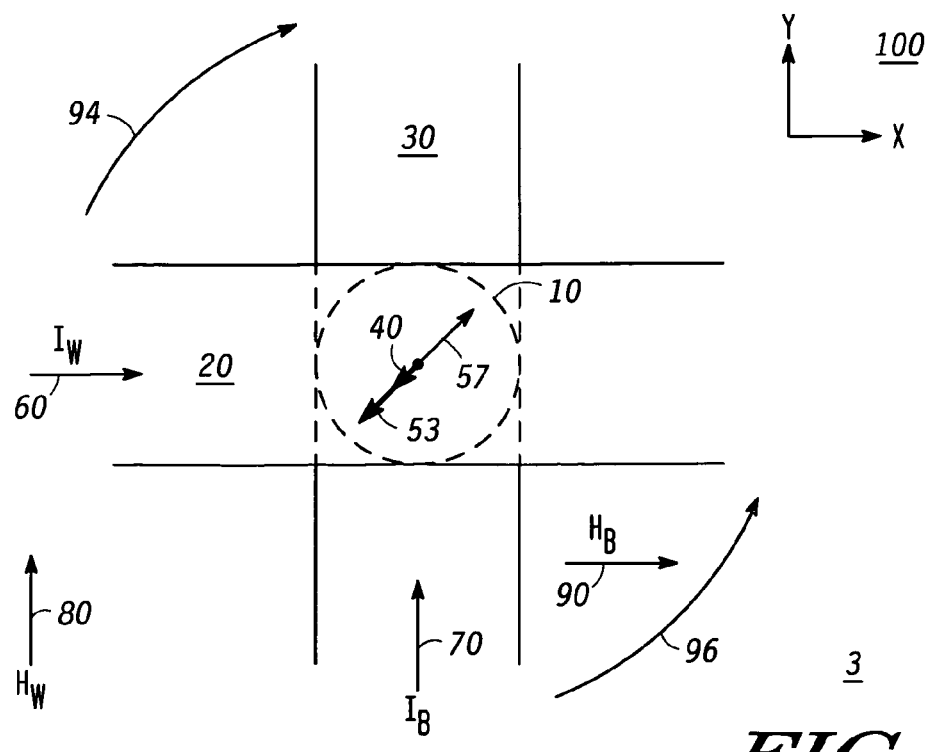
FIG. 2 is a simplified plan view of a magnetoresistive random access memory device with word and bit lines.

Turn now to FIG. 2, which illustrates a simplified plan view of a MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In the preferred embodiment, a write word current 60 is defined as being positive if flowing in a positive x-direction and a write bit current 70 is defined as being positive if flowing in a positive y-direction. The purpose of write word line 20 and write bit line 30 is to create a magnetic field within MRAM device 10. A positive write word current 60 will induce a circumferential write word magnetic field, $H_w$ 80, and a positive write bit current 70 will induce a circumferential write bit magnetic field, $H_B$ 90. Since, in this example, write word line 20 is above MRAM device 10, in the plane of the element, $H_w$ 80 will be applied to MRAM device 10 in the positive y-direction for a positive write word current 60. Similarly, since write bit line 30 is below MRAM device 10, in the plane of the element, $H_B$ 90 will be applied to MRAM device 10 in the positive x-direction for a positive write bit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
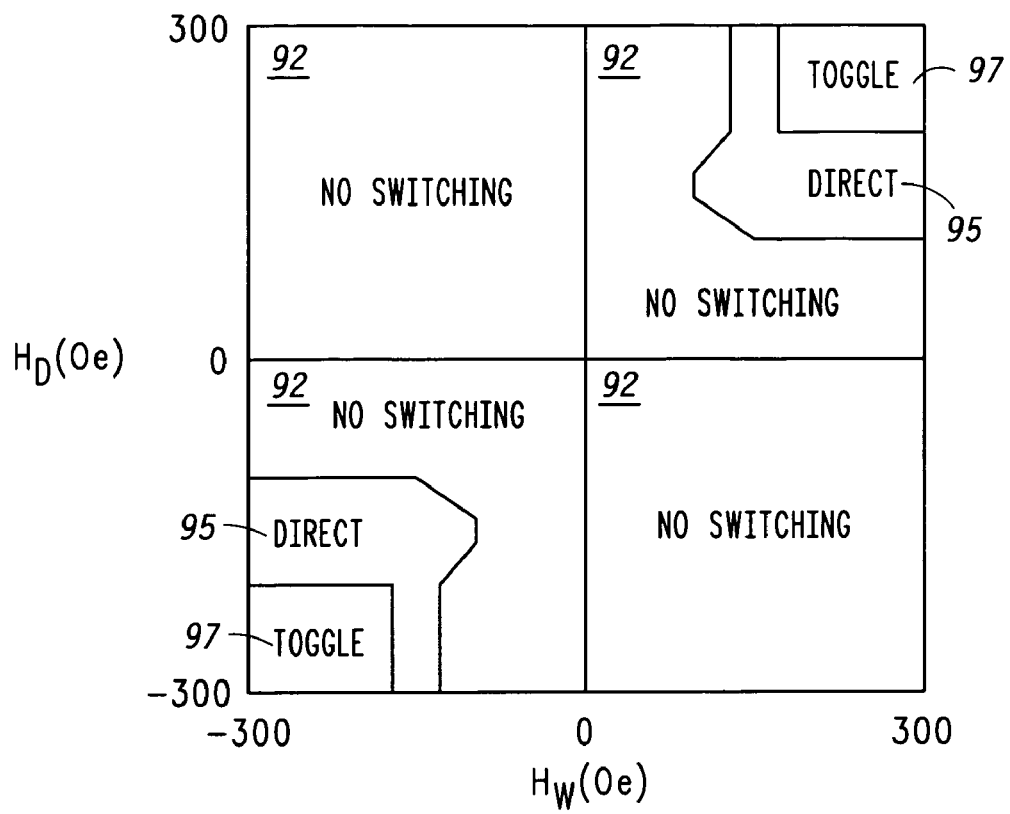
FIG. 3 is a graph illustrating a simulation of the magnetic field amplitude combinations that produce the direct or toggle write mode in the magnetoresistive random access memory device.
Figure 4:
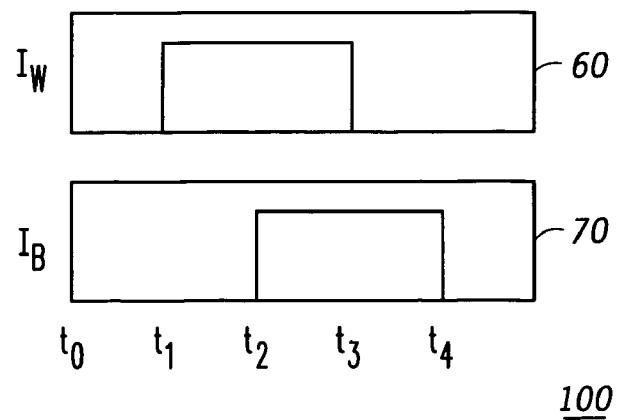

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the write word line magnetic field amplitude in Oersteds, and the y-axis is the write bit line magnetic field amplitude in Oersteds. The magnetic fields are applied in a pulse sequence 100 as shown in FIG. 4 wherein pulse sequence 100 includes write word current 60 and write bit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both write word line 20 and write bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the write word and write bit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both write word line 20 and write bit line 30. For example, if a '1' is initially stored then the state of the device will be switched to a '0' after one positive current pulse sequence is flowed through the write word and write bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in write word line 20 and write bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Figure 5:
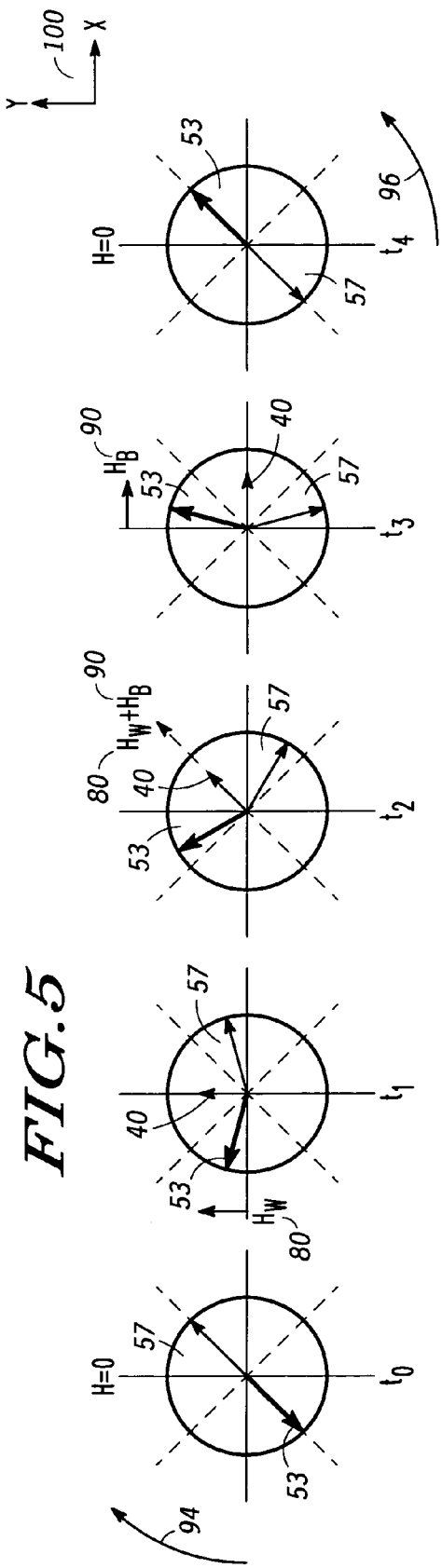
FIG. 5 is a diagram illustrating the rotation of the magnetic moment vectors for a magnetoresistive random access memory device for the toggle write mode when writing a '1' to a '0'.

Turn now to FIG. 5 which illustrates the toggle write mode for writing a '1' to a '0' using pulse sequence 100. In this illustration at time $t_0$, magnetic moment vectors 53 and 57 are oriented in the preferred directions as shown in FIG. 2. This orientation will be defined as a '1'.

At a time $t_1$, a positive write word current 60 is turned on, which induces $H_w$ 80 to be directed in the positive y-direction. The effect of positive $H_w$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_w$ 80. Hence, magnetic moment vector 53 is rotated in clockwise direction 94. Since resultant magnetic moment vector 40 is the vector addition of magnetic moment vectors 53 and 57, magnetic moment vector 57 is also rotated in clockwise direction 94.

At a time $t_2$, positive write bit current 70 is turned on, which induces positive $H_B$ 90. Consequently, resultant magnetic moment vector 40 is being simultaneously directed in the positive y-direction by $H_w$ 80 and the positive x-direction by $H_B$ 90, which has the effect of causing effective magnetic moment vector 40 to further rotate in clockwise direction 94 until it is generally oriented at a 45° angle between the positive x- and positive y-directions. Consequently, magnetic moment vectors 53 and 57 will also further rotate in clockwise direction 94.

At a time $t_3$, write word current 60 is turned off so that now only $H_B$ 90 is directing resultant magnetic moment vector 40, which will now be oriented in the positive x-direction. Both magnetic moment vectors 53 and 57 will now generally be directed at angles passed their anisotropy hard-axis instability points.

At a time $t_4$, write bit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y- and positive x-directions. This preferred direction is also 180° from the initial direction of magnetic moment vector 53 at time to and is defined as '0'. Hence, MRAM device 10 has been switched to a '0'. It will be understood that MRAM device 10 could also be switched by rotating magnetic moment vectors 53, 57, and 40 in counter clockwise direction 96 by using negative currents in both write word line 20 and write bit line 30, but is shown otherwise for illustrative purposes.

Figure 6:
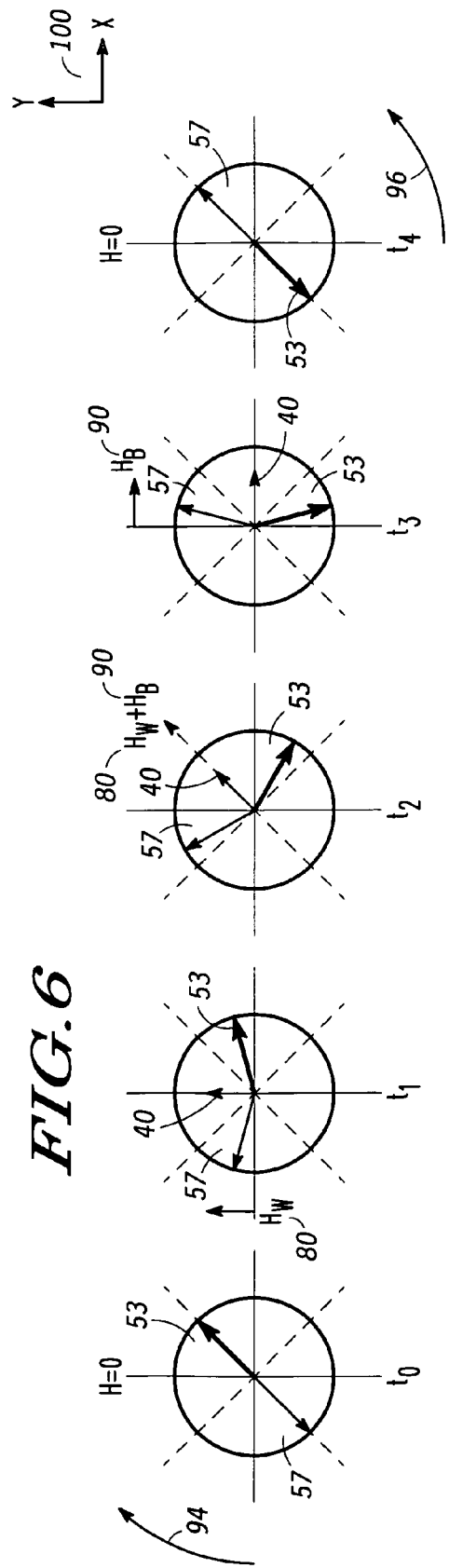
FIG. 6 is a diagram illustrating the rotation of the magnetic moment vectors for a magnetoresistive random access memory device for the toggle write mode when writing a '0' to a '1'.

Turn now to FIG. 6 which illustrates the toggle write mode for writing a '0' to a '1' using pulse sequence 100. Illustrated are the magnetic moment vectors 53 and 57, as well as resultant magnetic moment vector 40, at each of the times $t_0$, $t_1$, $t_2$, $t_3$, and $t_4$ as described previously showing the ability to switch the state of MRAM device 10 from '0' to 1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 7:
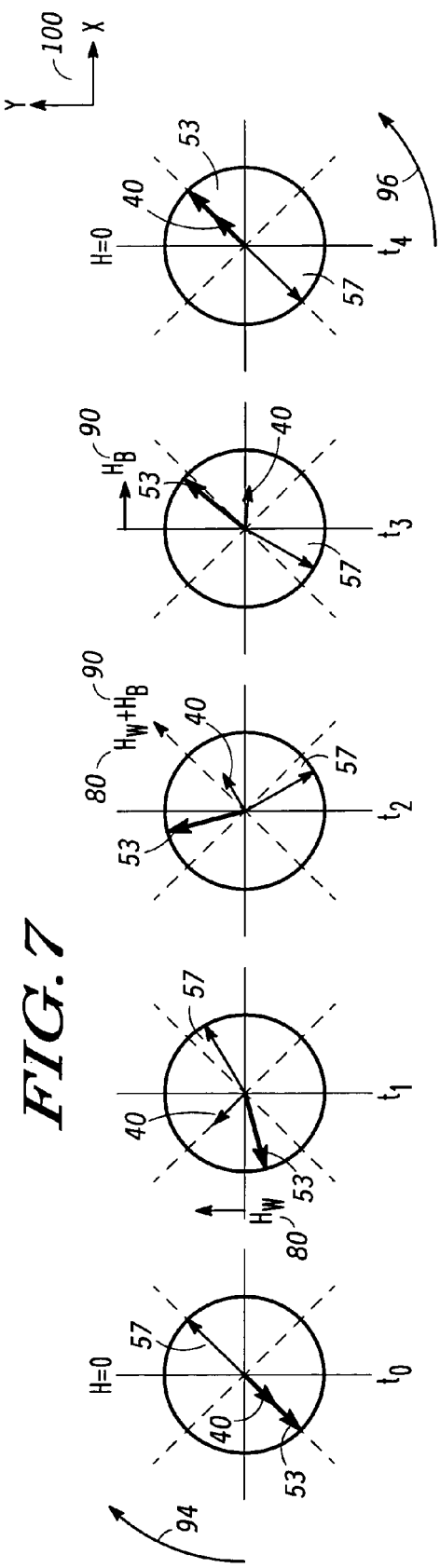
FIG. 7 is a graph illustrating the rotation of the magnetic moment vectors for a magnetoresistive random access memory device for the direct write mode when writing a '1' to a '0'.

Turn now to FIG. 7 which illustrates an example of writing a '1' to a '0' using the direct write mode using pulse sequence 100. Here again, the memory state is initially a '1' with magnetic moment vector 53 directed 45° with respect to the negative x- and negative y-directions and magnetic moment vector 57 directed 45° with respect to the positive x- and positive y-directions. Following the pulse sequence as described above with positive write word current 60 and positive write bit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with resultant magnetic moment 40 oriented at a 45° angle in the positive x- and positive y-directions as desired. Similar results are obtained when writing a '0' to a '1' only now with negative write word current 60 and negative write bit current 70.

Figure 8:
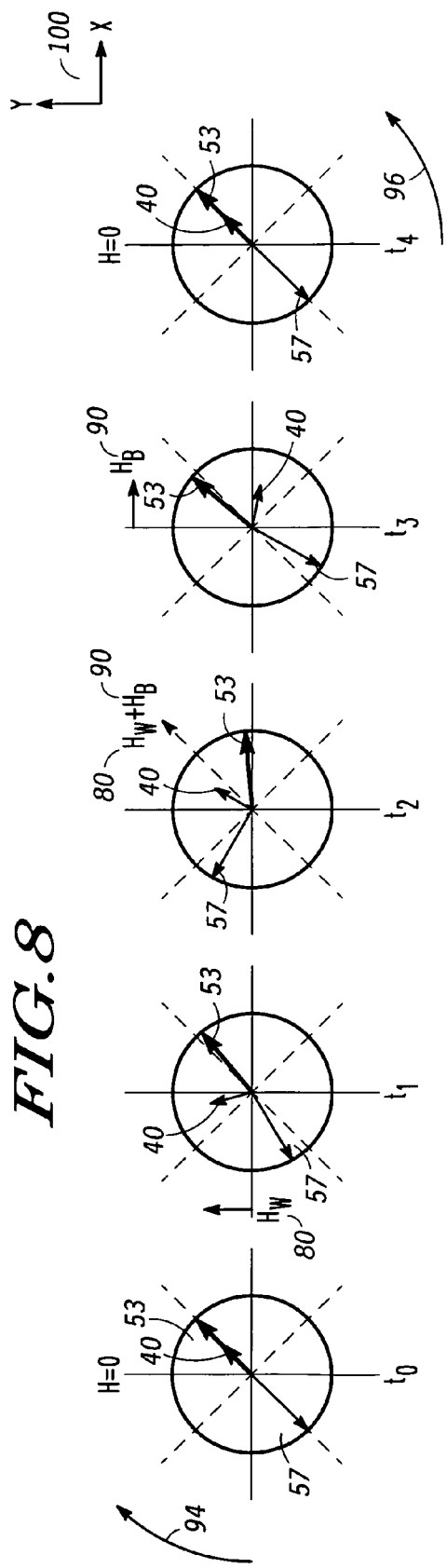
FIG. 8 is a graph illustrating the rotation of the magnetic moment vectors for a magnetoresistive random access memory device for the direct write mode when writing a '0' to a state that is already a '0'.

Turn now to FIG. 8 which illustrates an example of writing using the direct write mode when the new state is the same as the state already stored. In this example, a '0' is already stored in MRAM device 10 and current pulse sequence 100 is now repeated to store a '0'. Magnetic moment vectors 53 and 57 attempt to "FLOP" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 57 crosses the x-axis and the system stabilizes with the dominant moment 53 returned to near its original direction. Therefore, at a time $t_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both write word line 60 and write bit line 70 and, conversely, to write a '1' negative current is required in both write word line 60 and write bit line 70.

If larger fields are applied, eventually the energy decrease associated with a flop and scissor exceeds the additional energy barrier created by the dipole energy of the unbalanced moment which is preventing a toggle event. At this point, a toggle event will occur and the switching is described by region 97.

Region 95 in which the direct write mode applies can be expanded, i.e. toggle mode region 97 can be moved to higher magnetic fields, if the times $t_3$ and $t_4$ are equal or made as close to equal as possible. In this case, the magnetic field direction starts at 45° relative to the bit anisotropy axis when write word current 60 turns on and then moves to parallel with the bit anisotropy axis when write bit current 70 turns on. This example is similar to the typical magnetic field application sequence. However, now write word current 60 and write bit current 70 turn off substantially simultaneously, so that the magnetic field direction does not rotate any further. Therefore, the applied field must be large enough so that the resultant magnetic moment vector 40 has already moved past its hard-axis instability point with both write word current 60 and write bit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 9:
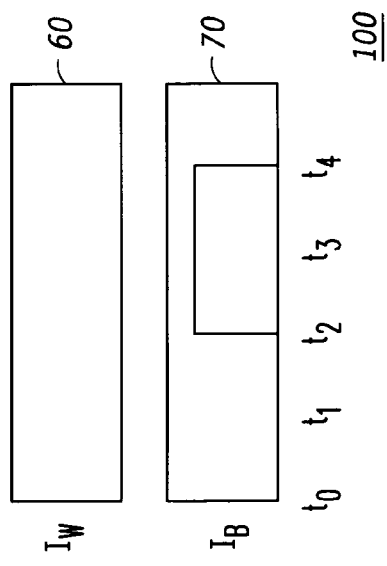
Figure 10:
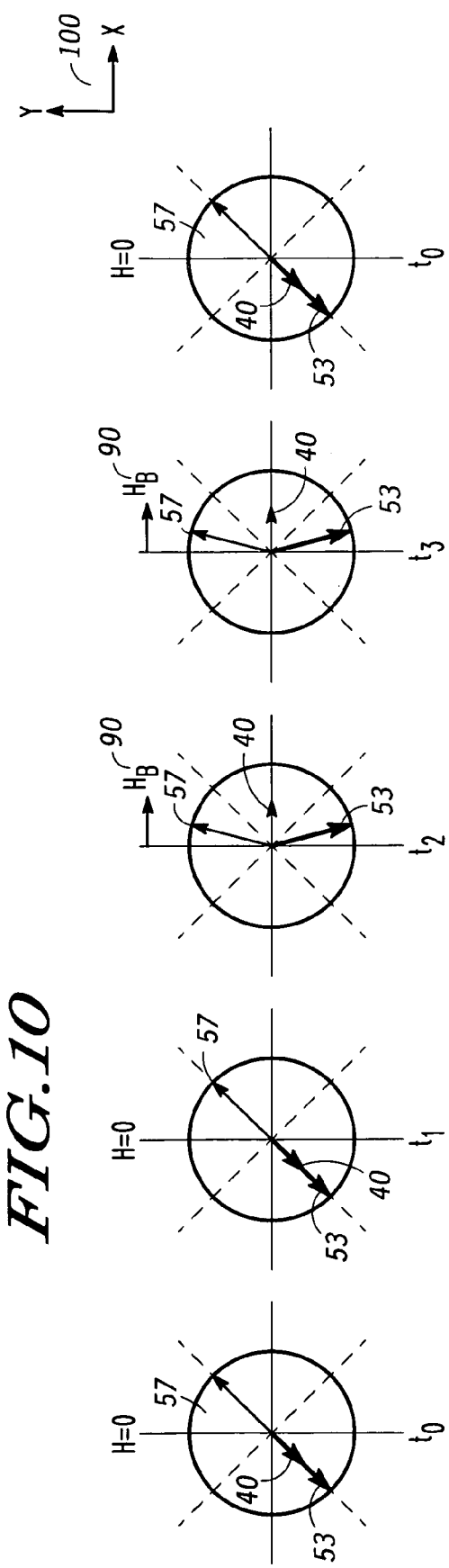

The writing methods described previously are highly selective because only the MRAM device that has both write word current 60 and write bit current 70 turned on between time $t_2$ and time $t_3$ will switch states. This feature is illustrated in FIGS. 9 and 10. FIG. 9 illustrates pulse sequence 100 when write word current 60 is not turned on and write bit current 70 is turned on. FIG. 10 illustrates the corresponding behavior of the state of MRAM device 10. At a time $t_0$, magnetic moment vectors 53 and 57, as well as resultant magnetic moment vector 40, are oriented as described in FIG. 2. In pulse sequence 100, write bit current 70 is turned on at a time $t_1$. During this time, $H_B$ 90 will cause resultant magnetic moment vector 40 to be directed in the positive x-direction.

Since write word current 60 is never switched on, resultant magnetic moment vectors 53 and 57 are never rotated through their anisotropy hard-axis instability points. As a result, magnetic moment vectors 53 and 57 will reorient themselves in the nearest preferred direction when write bit current 70 is turned off at a time $t_3$, which in this case is the initial direction at time $t_0$. Hence, the state of MRAM device 10 is not switched. It will be understood that the same result will occur if write word current 60 is turned on at similar times described above and write bit current 70 is not turned on. This feature ensures that only one MRAM device in an array will be switched, while the other devices will remain in their initial states. As a result, unintentional switching is avoided and the bit error rate is minimized.

Figure 11:
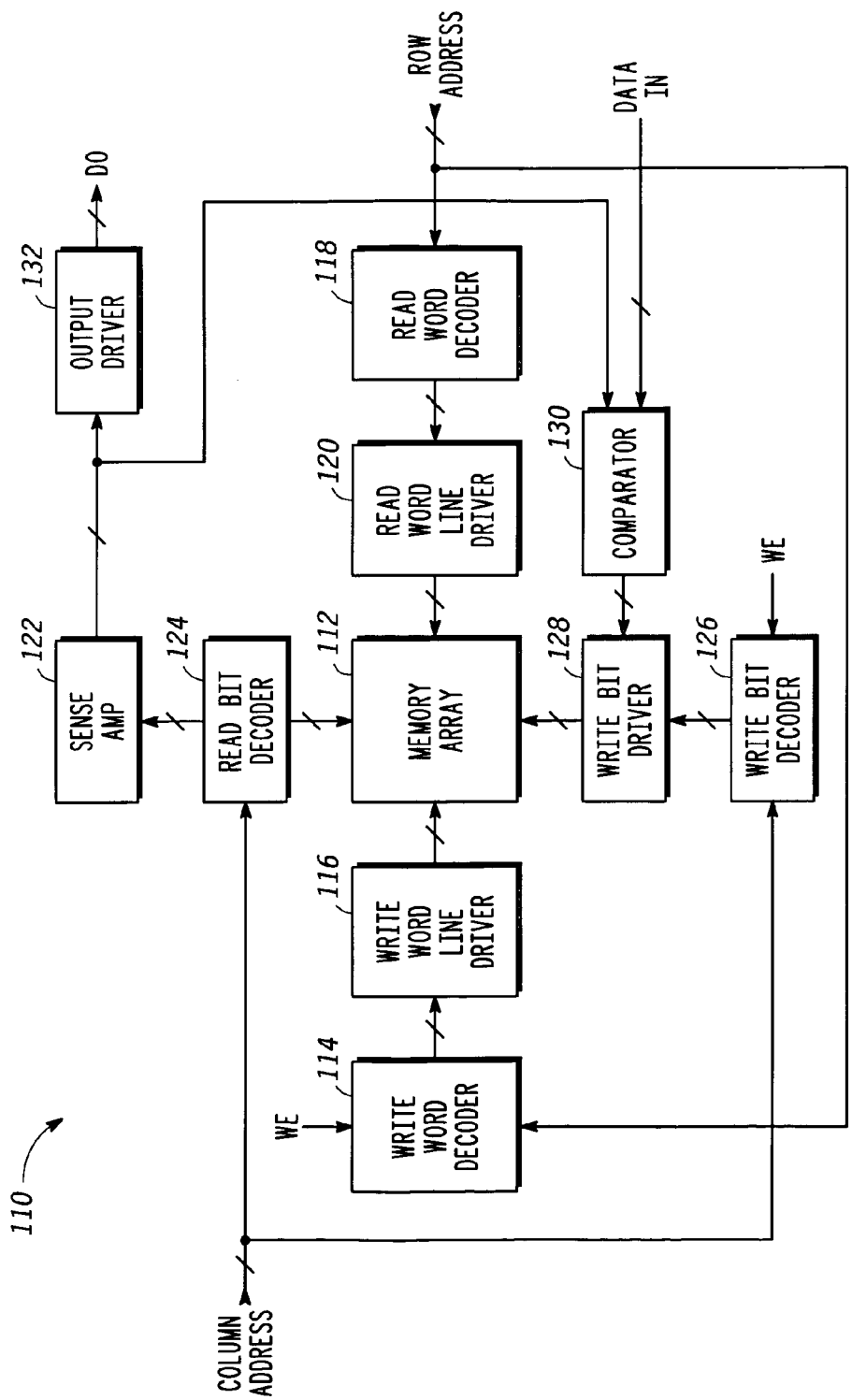
FIG. 11 is a block diagram of a toggle memory according to an embodiment of the invention.

Shown in FIG. 11 is a memory 110 comprising a memory array 112, a write word decoder 114, a write word line driver 116, a read word decoder 118, a read word line driver 120, one or more sense amplifiers 122, a read bit decoder 124, a write bit decoder 126, a write bit driver 128, a comparator 130, and an output driver 132. These elements are coupled together by multiple lines. For example read bit decoder 124 receives a column address made up of multiple address signals. Memory array 112 is an array of memory cells that can be switched with a toggle operation. A section of memory cells for the memory array 112 is memory array 200 shown in FIG. 14, which is an MRAM cell array that is written in the method described for memory array 3 of FIG. 1 in that writing occurs in four steps of 45° angles until 180° is reached. In this particular preferred cell array, there are separate word lines and bit lines for a write operation and a read operation.

Read word decoder 118 receives a row address and is coupled to read word line driver 120, which in turn is coupled to memory array 112. For a read, read word decoder 118 selects a read word line in memory array 112 based on the row address. The selected word line is driven by read line driver 120. Read bit decoder 124, which receives the column address and is coupled between sense amplifier 122 and memory array 112, selects a read bit line from read bit decoder 124, based on the column address, from memory array 112 and couples it to sense amplifier 122. Sense amplifier 122 detects the logic state and couples it to output driver 132 and comparator 130. Output driver 132, for a read, provides a data output signal DO. For a write operation, comparator 130 compares the logic state of the selected cell, which is provided by sense amplifier 122, to the desired logic state to be written as provided by the data in.

Write word decoder 114 receives the row address and is coupled to write word line driver 116, which in turn is coupled to memory array 112. For a write, write word decoder 114 selects a write word line, based on the row address, in memory array 112, and write word line driver in turn drives that selected write word line. Write bit decoder 126 receives the column address and is coupled to the write bit driver 128, which is coupled to the memory array 112. Writer bit decoder 126 selects a write bit line, based on the column address, and write bit driver 128 in turn drives the selected write bit line in order to toggle the state of the selected cell.

Since memory array 112 is a toggle memory, a write toggling operation is completed only if the logic state of the cell needs to be flipped in order to achieve the desired resulting logic state for the selected cell. Thus, comparator 130 receives the output of a read operation on the selected cell from sense amplifier 122 and determines if the selected cell already has the desired logic state. If the selected cell, as determined by the row and column address, does have the desired logic state, then the write operation is terminated. If the logic state of the selected cell is different from the desired state then the comparator indicates to write bit driver 128 that the write is to continue and the write bit driver for the selected write bit line drives the selected write bit line.

Figure 12:
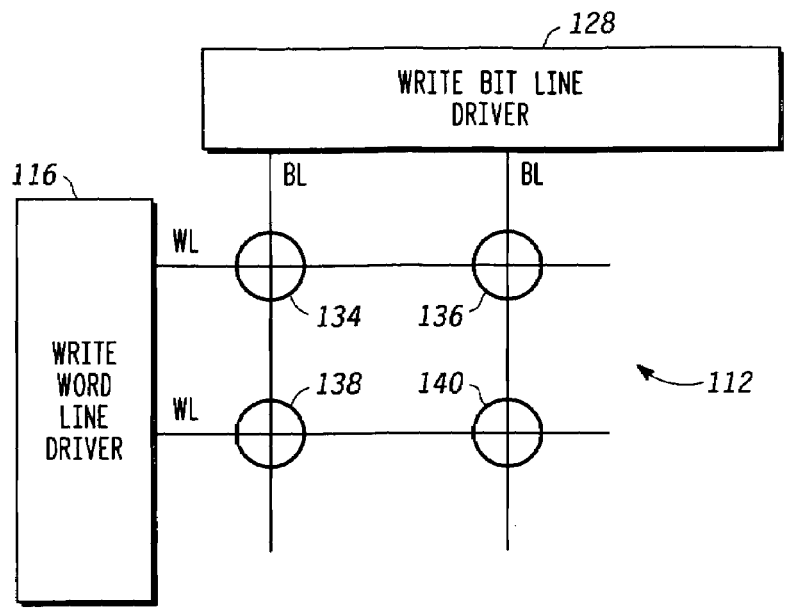
FIG. 12 is a more detailed diagram of a portion of the memory of FIG. 11.

Shown in FIG. 12 is a portion of memory 110 of FIG. 11 comprising the write word line driver 116 coupled to write word lines WL, write bit driver 128 coupled to write bit lines BL, and cells 134, 136, 138, and 140 coupled at intersection of write bit lines BL and write word lines WL. For a write to occur, current is provided to a selected word line WL, while no current is flowing in the selected write bit line, for sufficient time to cause the first angle change in the memory cells along the selected write word line. While current is still flowing in the selected write word line, current is flowed through the selected write bit line to cause the second angle change to the selected memory cell. Only at the intersection of the current carrying write bit line and write word line does this second angle change occur. While current is still flowing through the write bit line, current flow is terminated through the selected write word line to cause a third angle change in the selected memory cell. Only at the intersection of the selected write bit line and the selected write word line does this third change occur. A fourth angle change of the selected memory cell occurs when the current through the selected write bit line is terminated.

Figure 13:
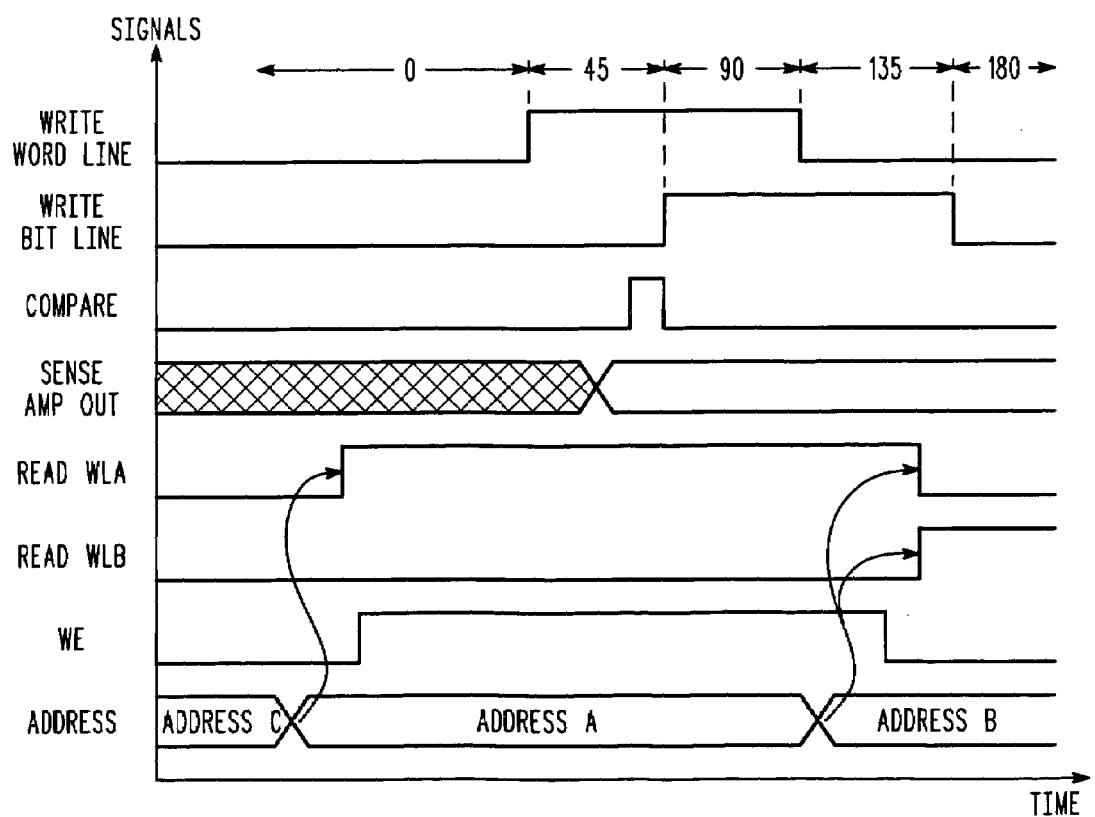
FIG. 13 is a timing diagram useful in understanding the operation of the memory of FIG. 11.

The write operation of memory 110 is further explained by reference to the timing diagram of FIG. 13. Both a read operation and a write toggle operation are initiated by a change in the row or column address as shown by enabling a read word line WLA as shown in FIG. 13. Although the write cannot be executed until it has been determined that the logic state needs to flipped, nonetheless, the write cycle can begin as noted by the write word line being enabled prior to the sense amplifier providing its output and the comparator determining if the logic state needs to be flipped. Enabling (causing current to flow through) the write word line does cause the first angle change in the selected cell as well as all of the cells along the selected write word line, but this change is reversed if the current is terminated without enabling the write bit line.

Thus, the selected write word line can be enabled prior to the comparator making its determination because the first angle change is reversed simply by removing the current. This must be the case because all of the cells on a selected write word line experience the first angle change and all but one are not selected. Only the selected cell, however, experiences the second angle change and that occurs when the write bit line is enabled. This is shown as occurring after the comparator has made its determination that a logic state change is desired. The first angle change is shown as being from 0° to 45° and the second change is from 45° to 90°. The third angle change is shown as occurring when the write word line is disabled (current is terminated). This is shown as being from 90° to 135°. The final angle change shown is the fourth angle change and occurs when the write bit line is disabled. This angle change is shown as being from 135° to 180°.

This also shows that the final stages of the write can continue after the next address change, which initiates another cycle. The beginning of a cycle always begins with a read even if the cycle is a write cycle. Address A is changed to address B and causes read word line B to be selected. This does not interfere with the writing of the previously selected cell. This depicts a read word line change, but even if the address is a column only change so that the selected read word line does not change, the continued flow of current does not adversely affect the completion of the write. Also note that it is not necessary that the write enable be active at the time the cycle begins, because all cycles begin with a read operation anyway. The write enable signal must be active sufficiently early though for the write bit line to become active.

The explanation has been with respect to a single cell being selected, but this was for ease of understanding. In practice, typically a number of cells will be selected and that is indicated in FIG. 11 by the signal connections between the elements being multiple signal lines. Thus, for example, if memory 110 were a x16 memory, comparator 130 would actually make 16 different comparisons, one for each selected cell. Of the sixteen comparisons, only those that indicated a non-match would cause a write operation of those selected cells with the non-match. The selected cells that resulted in a match would not be flipped.

Figure 14:
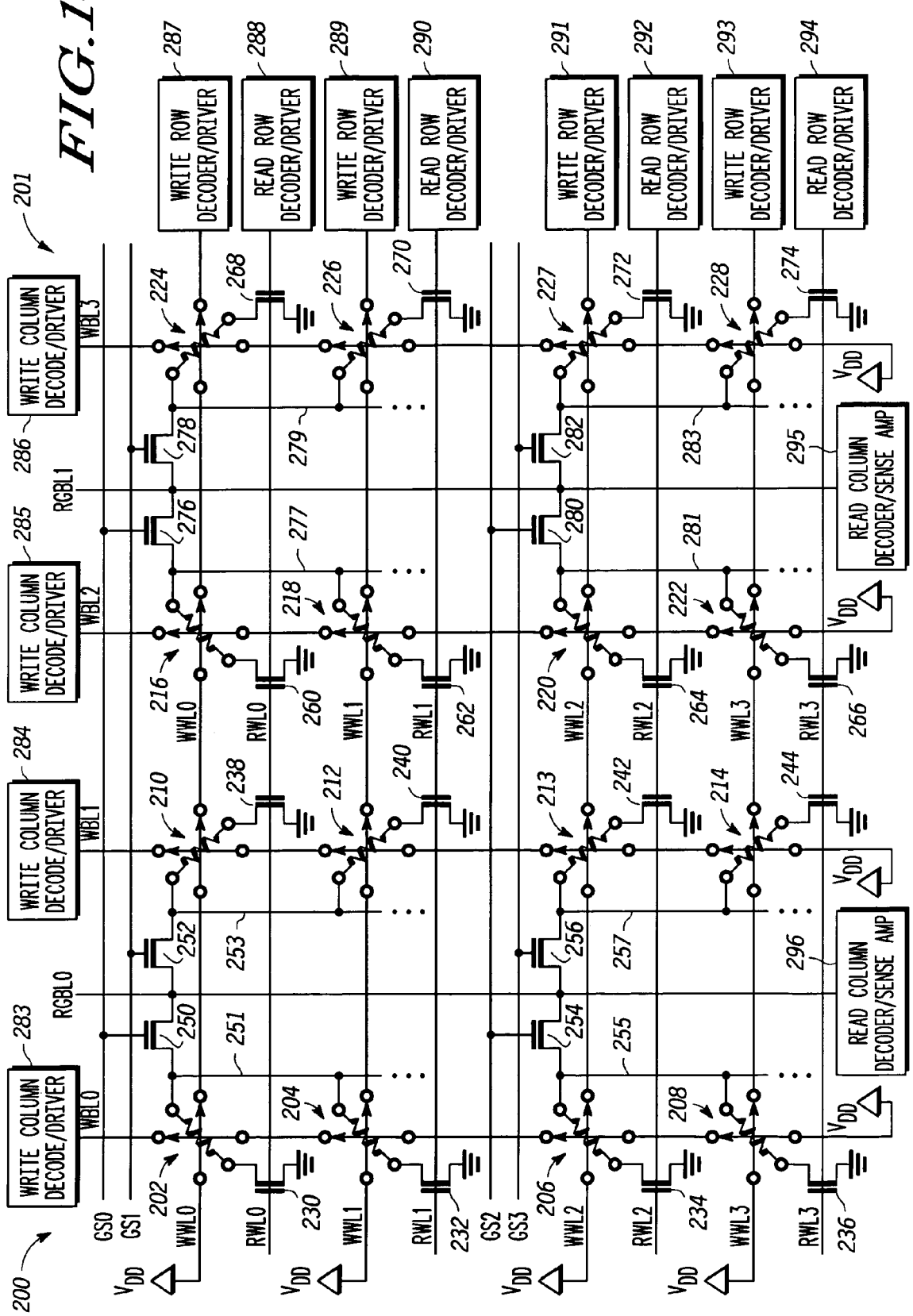
FIG. 14 is a circuit diagram of a portion of the memory of FIG. 11 showing an embodiment of the inventive architecture.

Shown in FIG. 14 is a portion of memory array 200 and a plurality of driver, decoder, and sensing blocks that combine to form a memory core 201. The portion of memory array 200 comprises MRAM devices 202, 204, 206, 208, 210, 212, 213, 214, 216, 218, 220, 222, 224, 226, 227, and 228. Each of these MRAM devices has three current paths. A first current path and second current path of these three paths, which are shown as orthogonal to each other, represent the write paths. These two paths carry the signals, shown in FIGS. 12 and 13, that switch the logic state of the cell. The third current path, which is shown as a resistor at a 45 degree angle, represents a read current path through a magnetoresistive tunnel junction that is programmed to one of two possible resistive states. The memory array 200 further comprises select transistors 230, 232, 234, 236, 238, 240, 242, 244, 260, 262, 264, 266, 268, 270, 272, and 274, that are in series with the third current path, which is the read current path, of corresponding MRAM devices 202, 204, 206, 208, 210, 212, 213, 214, 216, 218, 220, 222, 224, 226, 227, and 228, respectively. This connection of the select transistors is with one current electrode of these transistors coupled to the third current path and the second current electrode coupled to ground (VSS). Each combination of a select transistor device and MRAM device comprises a memory cell.

The memory core 201 comprises write word lines WWL0, WWL1, WWL2, and WWL3 that run through the first current paths of the MRAM devices. WWL0 runs through MRAM devices 202, 210, 216, and 224. WWL1 runs through MRAM devices 204, 212, 218, and 226. WWL2 runs through MRAM devices 206, 213, 220, and 227. WWL3 runs through MRAM devices 208, 214, 222, and 228. Memory array 200 further comprises write bit lines WBL0, WBL1, WBL2, and WBL3 that run through the second current paths of the MRAM devices. WBL0 runs through MRAM devices 202, 204, 206, and 208. WBL1 runs through MRAM devices 210, 212, 213, and 214. WBL2 runs through MRAM devices 216, 218, 220, and 222. WBL3 runs through MRAM devices 224, 226, 227, and 228. Yet further memory array 200 comprises read word lines RWL0, RWL1, RWL2, and RWL3 that are coupled to the gate of the select transistors. RWL0 is coupled to select transistors 230, 238, 260, and 268. RWL1 is coupled to select transistors 232, 240, 262, and 270. RWL2 is coupled to select transistors 234, 242, 264, and 272. RWL3 is coupled to select transistors 236, 244, 266, and 274. Memory array 200 also comprises read global bit lines RGBL0 and RGBL1 group select lines GS0, GS1, GS2, and GS3.

Memory array 200 further comprises group select transistors 250, 252, 254, 256, 276, 278, 280, and 282 that are for coupling groups of memory cells to read global bit lines. Also comprising memory array 200 are local bit lines 251, 253, 255, 257, 277, 279, 281, and 283, which are each coupled to the third current paths of the MRAM devices for their groups. That is, there is one of these local bit lines for each group.

Transistors 250 and 252 have first current electrodes coupled together and to read global bit line RGBL0. Transistors 254 and 256 have first current electrodes coupled together and to read global bit line RGBL0. Transistors 276 and 278 have first current electrodes coupled together and to read global bit line RGBL1. Transistors 280 and 282 have first current electrodes coupled together and to read global bit line RGBL1. Transistors 250, 252, 254, 256, 276, 278, 280, and 282 each have second current electrodes coupled to local bit lines 251, 253, 255, 257, 277, 279, 281, and 283. Local bit lines 251, 253, 255, 257, 277, 279, 281, and 283 are coupled to the third current path of MRAM devices 202 and 204, 206 and 208, 210 and 212, 213 and 214, 216 and 218, 220 and 222, 224 and 226, and 227 and 228, respectively. Group select line GS0 is coupled to group select transistor 250 and 276. Group select line GS1 is coupled to group select transistor 252 and 278. Group select line GS2 is coupled to group select transistor 254 and 280. Group select line GS3 is coupled to group select transistor 256 and 282.

Memory core 201, in addition to memory array 200, comprises write column decoder/drivers 283, 284, 285, and 286; write row decoder/drivers 287, 289, 291, and 293; read row decoder/drivers 288, 290, 292, and 294; and read column decoder/sense amplifiers 295 and 296. Write column decoder/drivers 283, 284, 285, and 286 are connected to write bit lines WBL0, WBL1, WBL2, and WBL3, respectively. Write row decoder/drivers 287, 289, 291, and 293 are coupled to write word lines WWL0, WWL1, WWL2, and WWL3, respectively. Read row decoder/drivers 288, 290, 292, and 294 are coupled to read word lines RWL0, RWL1, RWL2, and RWL3, respectively. Read column decoder/sense amplifiers 296 and 295 are coupled to read global bit lines RGBL 0 and RGBL 1, respectively.

In operation, an MRAM device, such as MRAM device 202, is written by applying current through a selected write word line, such as WWL0, and a selected write bit line, such as WBL0 in this example, to toggle the state of the memory. Also, the state can be written directly through WWL0 and WBL0 as well if the memory cell is a direct write cell instead a toggle cell. All of the MRAM devices are selected by flowing current through the write word lines and write bit lines for the particular MRAM device. The state of an MRAM device, such as MRAM device 202, is read by applying a sufficient voltage to the gate of its corresponding select transistor, such as transistor 230 via read word line RWL0, applying a sufficient voltage to the gate of the corresponding group transistor, such as transistor 250 via group select line GS0, and sensing the state of the selected MRAM device, MRAM device 202 in this example via read global bit RGBL0 by column decoder/sense amplifier 296. A group is made up MRAM devices that have their third current paths commonly connected. Thus the capacitance added to the read global bit lines by the cells themselves is limited to the cells that are in the group. Also transistors, 250 and 252 have commonly connected current electrodes, the gates are coupled to different select lines. This has the effect of folding groups to have a common global bit line and having the selection between groups achieved by separate global select lines. Thus there are additional lines in the row direction and fewer in the column direction. The benefit is that the increase in lines in the row direction is one for each group of cells. If the group is 32, which is considered a preferred amount, then there is an additional global select lines for a distance of 32 cells. For the unfolded case, there is one read global bit line for each column instead of one for every two columns for the folded case. Thus, the effect of the unfolded case compared to the folded case is one extra read global bit line for every two columns, which is two cell widths. Thus, the tradeoff is clearly in the favor of the folded bit line. This space advantage can be used to either increase the size of lines to reduce their resistance or decrease the size of the memory core, or a combination of the two.

Further, by separating the write from the read lines, one end of the write lines can be directly connected to a power supply, VDD, eliminating a second current switch that is required if the read and write share the same line. Thus, the total area for the write driver is smaller and the average bit size for the memory core is smaller. Also by eliminating the need to switch a line between read and write, the write voltages can be optimized for performance without the risk of damaging the read circuits. Further, because the select transistors do not receive the write voltages, these select transistors can be made to much smaller sizes because they do not have to receive the write-level voltages. Thus, for example, each of the write bit lines and word lines uses a certain maximum voltage which may be VDD. The select transistors 230, 232, 234, 236, 238, 240, 242, 244, 260, 262, 264, 266, 268, 270, 272, and 274 that are part of the memory cells each have a control electrode oxide voltage rating that is less than VDD. This reduces the size of the memory cell. This is particularly significant, when it is common to have transistors made differently for differing voltage requirements.

Figure 15:
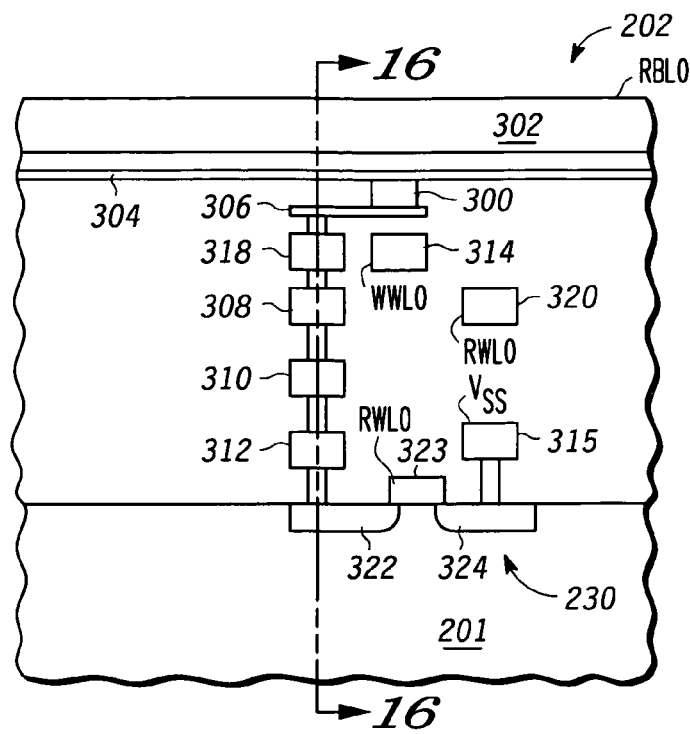
FIG. 15 is a first cross section of a memory cell used in the implementation of the architecture of FIG. 14.

Shown in FIG. 15 is a cross section of a memory cell comprised of MRAM device 202 and transistor 230. This shows the common elements of a MRAM device arranged to take advantage of the architecture of FIG. 14. In a typical application of MRAM technology, the MRAM devices will be present on a circuit with extensive logic such as a microprocessor. In such a case there would be several levels of metal to accommodate the logic design and the storage element of the MRAM device would be manufactured after those metal layers have been formed. This is due to the typical tunnel junction not being able to handle temperatures above about 400 degrees Celsius without degradation.

MRAM device 202 comprises a tunnel junction 300, interconnect 306, and interconnect 304, and write current paths 314 and 302. Interconnect 304 is also local bit line 251. Transistor 230 comprises a source 324, a drain 322, and a gate 323. The drain 322 of transistor 230 is connected to MRAM device 202 via an interconnect 318, an interconnect 308, an interconnect 310, and an interconnect 312, which are formed as metal layers for use as logic. These metal interconnect layers are connected together by vias as is well known. Write current path 314 is formed in the same metal layer as interconnect 318. Gate 323 is part of the read word line RWL0 periodically connected to interconnect 320. The use of interconnect 320 is to reduce the resistance of RWL0. This is a common strapping technique to avoid the relatively high resistance of polysilicon.

Figure 16:
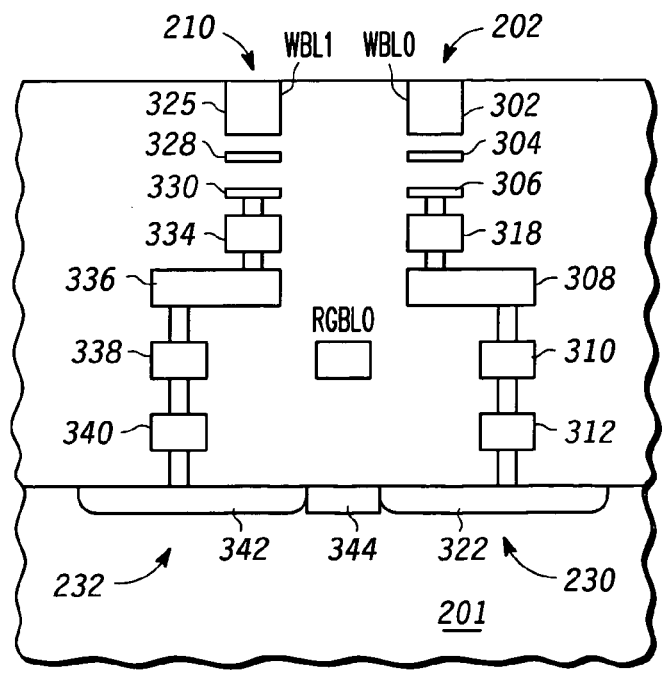
FIG. 16 is a second cross section of the memory cell of FIG. 15.

Shown in FIG. 16 is cross section taken through MRAM device 202 and transistor 230 as indicated in FIG. 15. This cross section is extended to include MRAM device 210 and transistor 238. This shows read global bit line RGBL0 at the same level of interconnect as interconnect 310. Notice that tunnel junction 300 and WWL0 are offset from the cross section line and so are not present in FIG. 16. The portion of MRAM device 210 present in FIG. 16 is write bit line WBL1. Similar to MRAM device 202, the third current path of MRAM device 210 is connected to transistor 232 by interconnect 340, interconnect 338, interconnect 336, interconnect 334, and interconnect 330. Interconnect 330 and 306 provide the direct connection to the tunnel junctions of MRAM devices 210 and 202, respectively. These cross sections show that this architecture can be made without requiring unusual structures that would require special processing.

Figure 17:
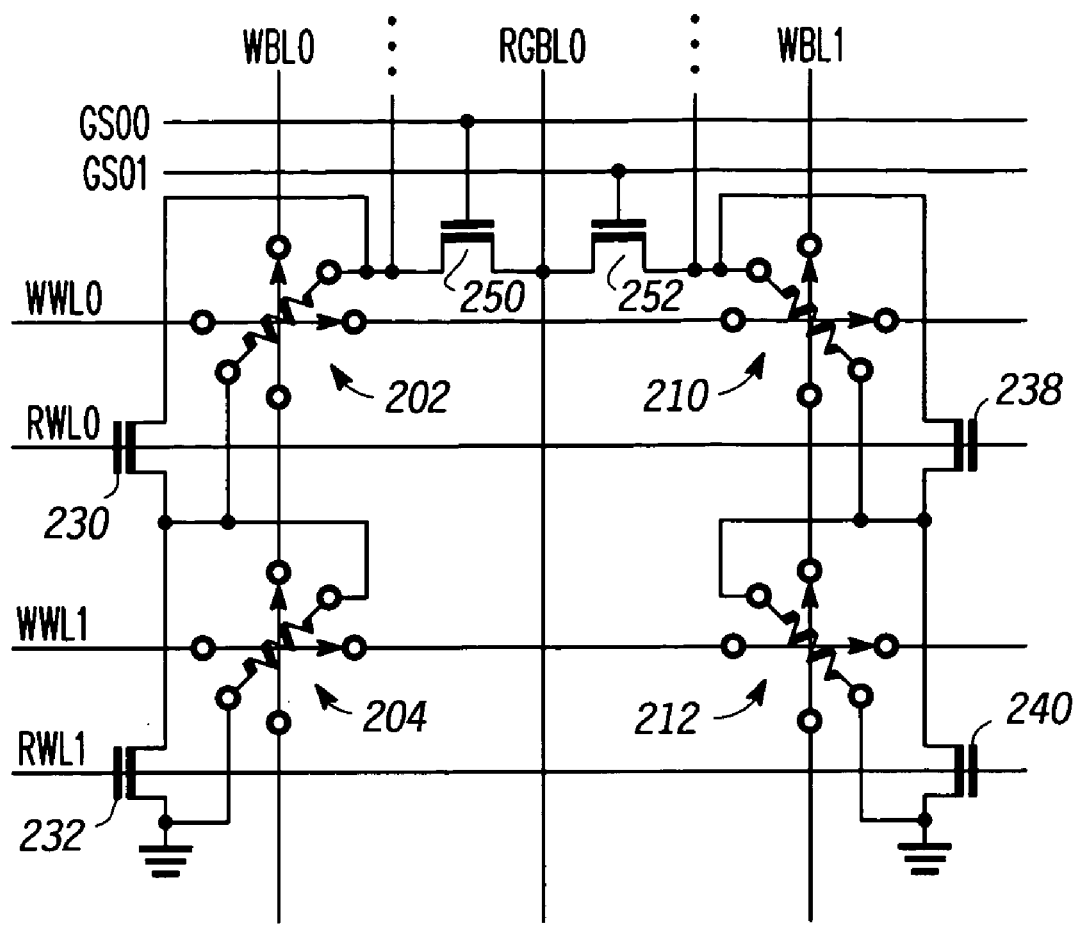
FIG. 17 is a circuit diagram showing a variation on the circuit diagram of FIG. 14.

Shown in FIG. 17 is a portion of an alternative to that shown in FIG. 14. In this case the memory cells in each group are arranged as a series memory. Each of the plurality of groups of adjacent bit cells is connected in series to a reference. In this case the reference is ground. There is no local bit line in this alternative. Similar device numbers are retained for similar features.

Various changes and modifications to the embodiments herein chosen for purposes of illustration will readily occur to those skilled in the art. To the extent that such modifications and variations do not depart from the spirit of the invention, they are intended within the scope thereof which is assessed only by a fair interpretation of the following claims.

The invention claimed is:

1. A memory comprising:

an array of random access memory cells having MTJs arranged in a plurality of rows and columns, each intersection of the plurality of rows and columns forming a memory cell;

a plurality of write bit lines, each of the plurality of write bit lines used to place a data value in a predetermined memory cell located within a predetermined column of the array of random access memory cells;

a plurality of read bit lines, each of the plurality of read bit lines used to read the data value in a predetermined memory cell located within a predetermined column of the array of random access memory cells, the plurality of write bit lines being electrically isolated from the plurality of read bit lines; and a plurality of read word lines, each of the plurality of read word lines used with the read bit lines to read the data value in the predetermined cell located on a predetermined row of the memory cells; and a plurality of write word lines, each of the plurality of write word lines used with the write bit lines to place the data value in the predetermined memory cell located on the predetermined row of the memory cells, the plurality of write word lines being electrically isolated from the MTJs;

wherein each of the plurality of write bit lines further comprises a write bit line conductor in close proximity but not in direct contact with a magnetic tunnel junction in a random access memory cell in the array of random access memory cells used for writing a state to the magnetic tunnel junction, the write bit line conductor being electrically isolated from all conductors of data content that are used to read a state of the magnetic tunnel junction.

2. The memory of claim 1, further comprising:

a plurality of write bit line current driver circuits, each of the plurality of write bit line current driver circuits driving one or more predetermined write bit lines; and a plurality of sense amplifier circuits, each of the plurality of sense amplifier circuits used to read a data content of one or more predetermined read bit lines, the plurality of sense amplifier circuits not sharing a common conductor of data content with the plurality of write bit line current driver circuits.

\* \* \* \* \*